US012812825B2

(12) United States Patent
Reimann et al.

(10) Patent No.: US 12,812,825 B2
(45) Date of Patent: Nov. 24, 2026

(54) CURRENT LINE TUBE AND CONVERTER ASSEMBLY COMPRISING SUCH A CURRENT LINE TUBE

(71) Applicants: Siemens Energy Global GmbH & Co. KG, Munich (DE); Innomotics GmbH, Nuremberg (DE)

(72) Inventors: Oliver Reimann, Erlangen (DE); Guido Loges, Ober-Mörlen (DE); Wolfgang Voss, Oberreichenbach (DE); Timm Reimers, Drage (DE); Jens Wietoska, Bremen (DE)

(73) Assignees: SIEMENS ENERGY GLOBAL GMBH & CO. KG, Munich (DE); INNOMOTICS GMBH, Nuremberg (DE)

( * ) Notice: Subject to any disclaimer, the term of this patent is extended or adjusted under 35 U.S.C. 154(b) by 265 days.

(21) Appl. No.: 18/729,377

(22) PCT Filed: Dec. 2, 2022

(86) PCT No.: PCT/EP2022/084258
§ 371 (c)(1),
(2) Date: Jul. 16, 2024

(87) PCT Pub. No.: WO2023/143782
PCT Pub. Date: Aug. 3, 2023

(65) Prior Publication Data

US 2025/0089223 A1 Mar. 13, 2025

(30) Foreign Application Priority Data

Jan. 27, 2022 (EP) .................................... 22153629

(51) Int. Cl.
*H05K 7/20* (2006.01)
*H05K 7/14* (2006.01)

(52) U.S. Cl.
CPC ..... *H05K 7/20927* (2013.01); *H05K 7/14329* (2022.08)

(58) Field of Classification Search
CPC .......... H05K 7/20927; H05K 7/14329; H10W 40/47; H10W 40/22; H10W 72/07331; H01M 10/6568
See application file for complete search history.

(56) References Cited

U.S. PATENT DOCUMENTS 4,051,509 A * 9/1977 Beriger ................. H10W 90/00 257/E23.098
2007/0189046 A1* 8/2007 Sugino .................... H02M 1/44 363/44

(Continued)

FOREIGN PATENT DOCUMENTS

CN 110301169 A 10/2019
CN 212275838 U 1/2021

(Continued)

OTHER PUBLICATIONS

China National Intellectual Property Administration Office Action; International Application No. 2024120401717290; Date of mailing: Dec. 4, 2024; 18 pages.

(Continued)

*Primary Examiner* — Michael A Matey
(74) *Attorney, Agent, or Firm* — CANTOR COLBURN LLP; Markus Meyer

(57) ABSTRACT

The invention relates to a current line tube having at least one line section designed in the form of a tube. In the process, the tube is used to conduct a coolant and includes of a material with an electric resistance of at least 0.075 μΩm. At least two coolant connections and at least two (Continued)

mutually spaced current connections are required, each current connection being arranged adjacently to a coolant connection.

13 Claims, 3 Drawing Sheets

(56) References Cited

U.S. PATENT DOCUMENTS

| | | | | |
|---|---|---|---|---|
| 2011/0235276 A1* | 9/2011 | Hentschel | H02M 7/003 | 361/699 |
| 2011/0284197 A1* | 11/2011 | Sugimoto | F28D 1/0333 | 165/185 |
| 2013/0128643 A1* | 5/2013 | Shinohara | H02M 7/003 | 363/131 |
| 2014/0153189 A1 | 6/2014 | Okamura | | |
| 2016/0181177 A1* | 6/2016 | Meyer | F28D 1/0246 | 165/80.4 |
| 2017/0142860 A1* | 5/2017 | Takeuchi | B60L 15/007 | |
| 2020/0053917 A1 | 2/2020 | Danov et al. | | |

FOREIGN PATENT DOCUMENTS

| | | |
|---|---|---|
| DE | 10109722 A1 | 9/2002 |
| EP | 2983261 A1 | 2/2016 |
| WO | 2023143782 A1 | 8/2023 |

OTHER PUBLICATIONS

European Search Report; International Application No. 22153629.5; International Filing Date: Jun. 30, 2022 ; Date of mailing: Dec. 7, 2022; 5 pages.

PCT International Search Report and Written Opinion of International Searching Authority mailed Feb. 8, 2023 corresponding to PCT International Application No. PCT/EP2022/084258; filed Dec. 2, 2022: 10 pages.

* cited by examiner

CURRENT LINE TUBE AND CONVERTER ASSEMBLY COMPRISING SUCH A CURRENT LINE TUBE

BACKGROUND

The invention relates to a power line pipe for use in a power converter arrangement, wherein the power line pipe is provided for electrical connection between a DC voltage network and a number of power converters.

A commonly used power converter arrangement usually comprises a plurality of power converters, which are connected to a DC voltage network together with the DC voltage side. The power converters are placed next to each other so that they can all be connected via a short line section. In principle, main busbars made of a highly conductive material, i.e. copper, are used, which are routed along one side of the power converters. From these main busbars, connection is then established to the power converters via short supply busbars.

The obvious advantage of this arrangement is the simple design and low electrical resistance, and thus low loss due to the connection arrangement.

A disadvantage of current power converters, however, is a problem that sometimes arises with such a parallel installation, in which the pulses generated by the power converters can generate an excitation in the connection arrangement. This, in turn, places an undesirable burden on the entire power converter arrangement.

DC link capacitors for damping or decoupling chokes for filtering the unwanted frequencies are often used to prevent harmful surges.

Such solutions in turn, however, cause undesirable power losses in the power converter arrangement.

SUMMARY

The object of the present invention is therefore to provide alternatives to the usual surge reduction measures, which have lower power losses.

In contrast to the generic form with a main busbar made of a highly conductive material, according to the invention a power line pipe made of a material with a higher resistance is used. The power line pipe includes a line section, at least two coolant connections and at least two power connections.

The power connections are electrically conductively connected to the line section and are spaced apart from each other, so that the circuit through the line section can be established via the power connections. The power connections can be mounted on the line section as well as permanently connected to the line section, for example, via a solder connection. The power connections can be arranged at one or both ends of the line section, as well as along the extent of the line section.

The line section is designed in the form of a pipe (it is irrelevant whether it has a round or angular or other type of cross-section) and allows a coolant to be carried. What type of coolant is used is initially irrelevant and it can thus be formed by a liquid as well as gases. For this purpose, the coolant connections are spaced apart from each other, wherein these can be arranged both at the end of the line section and along the extent of the line section. These at least allow the feeding or discharging of the coolant into or out of the line section.

Carrying the coolant through the line section, which also serves as a current conductor, allows both the feeding of the coolant to another location and the cooling of the line section itself, in particular at the same time. For this purpose, it is also provided that with at least two power connections, one coolant connection is arranged adjacent thereto in each case. It is not necessary for these to be arranged directly next to each other on the line section. Rather, the intention is to allow a feeding or discharging of the coolant in close proximity to a connection to a power connection.

One feature of the invention is that the material of which the line section consists has an electrical resistance of at least 0.075μΩm.

It has been shown to be advantageous if the material used for the production of the line section has a specific electrical resistance of at least 0.25 μm. A specific electrical resistance of at least 0.5 μΩm is particularly advantageous.

It is obvious that conduction losses increase as the specific resistance of the material used increases (assuming a constant cross-section). Accordingly, the electrical resistance should not be greater than 2 μΩm, particularly advantageously not greater than 1μΩm.

Since the current to be transmitted must be conducted through the power connections and these cannot be cooled as easily by a coolant flowing through the line section, it is advantageous, on the other hand, if the power connections are made of a different material, which has a specific electrical resistance of at most 0.05 μΩm. Particularly advantageous is the use of a material with an electrical resistance of at most 0.025 μΩm. This can prevent excessive heat generation in the power connection.

In the presence of a main connection, in particular for connection to a power grid, and at least two or more branches, for example to each power converter, the main connection is obviously under higher electrical load. In this respect, it is particularly advantageous if at least the main connection is made of a material, for example copper, which has a particularly low electrical resistance.

In one embodiment, the power line pipe is used to carry a DC voltage.

The design and arrangement of the power connections spaced apart from each other are initially irrelevant. However, it is particularly advantageous if a main connection is arranged as a power connection at one end of the line section. This allows both a beneficial use of the length of the line section and the simpler implementation of the main connection.

Since the line section is intended to carry a coolant in normal usage, it is further advantageous if, at least one end of the line section, a supply connection is present as a coolant connection. This allows the cooling of the line section up to this end on the one hand, as well as allowing a simple arrangement of the supply connection on a terminating element on the other.

It can be provided that the main connection is arranged at the opposite end of the advantageous supply connection. In contrast, it can also be provided that the main connection and the supply connection are arranged at the same end. For optimal flushing of the line section, it is particularly advantageous if a supply connection is arranged at both ends.

In one embodiment, the power line pipe is connected to a power converter. It can be provided that the connection is established via a main connection arranged at one end. However, it is advantageous if the power converter can be connected to a power connection arranged spaced apart from the ends.

In one embodiment, two power converters can be connected at the same time. For this purpose, preferably two power connections are arranged spaced apart from the ends of the line section.

In one embodiment, a power converter can be supplied with a cooling liquid via the power line pipe. To do this, it is advantageous to arrange the coolant connection adjacent to the power connection. With an arrangement of a power connection, particularly advantageously two power connections, along the extent of the line section it is correspondingly also advantageous if at least one coolant connection, particularly advantageously two coolant connections, are arranged on the line section spaced apart from the ends.

Depending on the length of the power line pipe, its attachment, as well as the connection of coolant lines and/or power lines, it can be advantageous if provision of an expansion-compensation means is made possible. For this purpose, the power line tube comprises a first line section and at least a second line section, wherein the line sections are connected to each other via an expansion-compensation means.

It can be provided in a first embodiment that the expansion-compensation means, along with a component, allows the coolant to be carried from one line section to the other line section, at the same time as conducting the current. For this purpose, the expansion-compensation means can be designed, for example, in the form of an electrically conductive and coolant-carrying folding bellows. Alternatively, it is possible to provide a pipe profile that connects the two ends of the pipe sections to each other in a U-shaped or meandering manner.

In a second embodiment, the expansion-compensation means between the two opposite ends of the line sections comprises a coolant-carrying folding bellows or compensator. It is not necessary for the folding bellows or the compensator to be electrically conductive. For this purpose, it is provided that the two ends of the line sections are connected to each other via an electrically conductive bridge, bypassing the folding bellows or compensator. Thus, the folding bellows or compensator can comprise, for example, a plastic material or a rubber-like material, while the bridge is made of a preferably highly conductive material.

It is intended that the coolant is carried via the coolant connections, while the current is conducted via the power connections. In order to prevent a current flow via the coolant connection, it can be provided that the coolant connection, in particular at the contact surfaces, is at least partially made of a non-conductive material.

If at one end of the line section no supply connection is arranged at the end side, at this end the power line tube advantageously has a terminating element for closing the line section. In particular, when a main connection is arranged at this end, it is further advantageous if the terminating element simultaneously forms the main connection.

The power line pipe according to the invention, as previously described, allows the realisation of a power converter arrangement according to the invention. In this case, the power converter arrangement comprises a first power line pipe and a second power line pipe, which is separated from the first power line pipe, designed in accordance with the previous description. Furthermore, the power converter arrangement comprises at least one power converter. It is provided that the power converter is connected in each case via at least one electrically conductive busbar to a respective power connection of the first or the second power line pipe. It is also provided that the power converter is simultaneously connected in each case via a non-conductive coolant pipe to a respective coolant connection of the first or the second power line pipe. This means that the power converter can be connected to the power grid via the power line pipes and be supplied with coolant at the same time.

In exemplary embodiments, the use of the power line pipes according to the invention is suitable if the power converter arrangement has at least two, particularly advantageously at least three, power converters, which are connected to the two power line pipes together. It is therefore obvious that an appropriate number of power connections and coolant connections are required on the respective power line pipe.

In this case, the connection of the power converter is preferably carried out in such a way that it is connected at a DC voltage side to the power line pipes and thus the power line pipes are used for carrying DC voltage.

In a further advantageous embodiment, a coolant supply means is provided for forming the power converter arrangement, which is connected via a first non-conductive connection pipe to the first supply connection of the first power line pipe, and via a second non-conductive connection pipe to the second supply connection of the second power line pipe. This allows a supply of coolant as well as a circulation of the coolant.

For this purpose, the coolant supply means advantageously comprises at least one coolant pump and at least one cooling device. This supports the circulation of the coolant and provides a correspondingly desired low temperature of the coolant.

In order to avoid a dead volume in a power line pipe, provided that no direct connection is established to a power converter, for example, at the end of the power line pipe opposite to the connection to the coolant supply means, it is advantageous if, at the end opposite to the connection to the coolant supply means, the power line pipes each have supply connections, which are connected to each other via a non-conductive connecting pipe, for example with a small cross-section, and thus allow a cooling circuit through the connecting pipe.

In addition, it can be provided that a capacitor is connected to the two power lines via additional power connections, in order to improve the damping or suppression of oscillations. However, no adjacent coolant circuits are required.

In exemplary embodiments, a power converter arrangement is provided when this is connected to a DC voltage network. For this purpose, the respective main connection of the two power line pipes is connected to the DC voltage network. It is provided that electrical consumers (of any type, e.g. motor, battery, etc.) are connected to the DC voltage network.

BRIEF DESCRIPTION OF THE DRAWINGS

In the following figures, a power converter arrangement according to the invention with power line pipes according to the invention is sketched. In the drawings.

DETAILED DESCRIPTION

Figure 1:
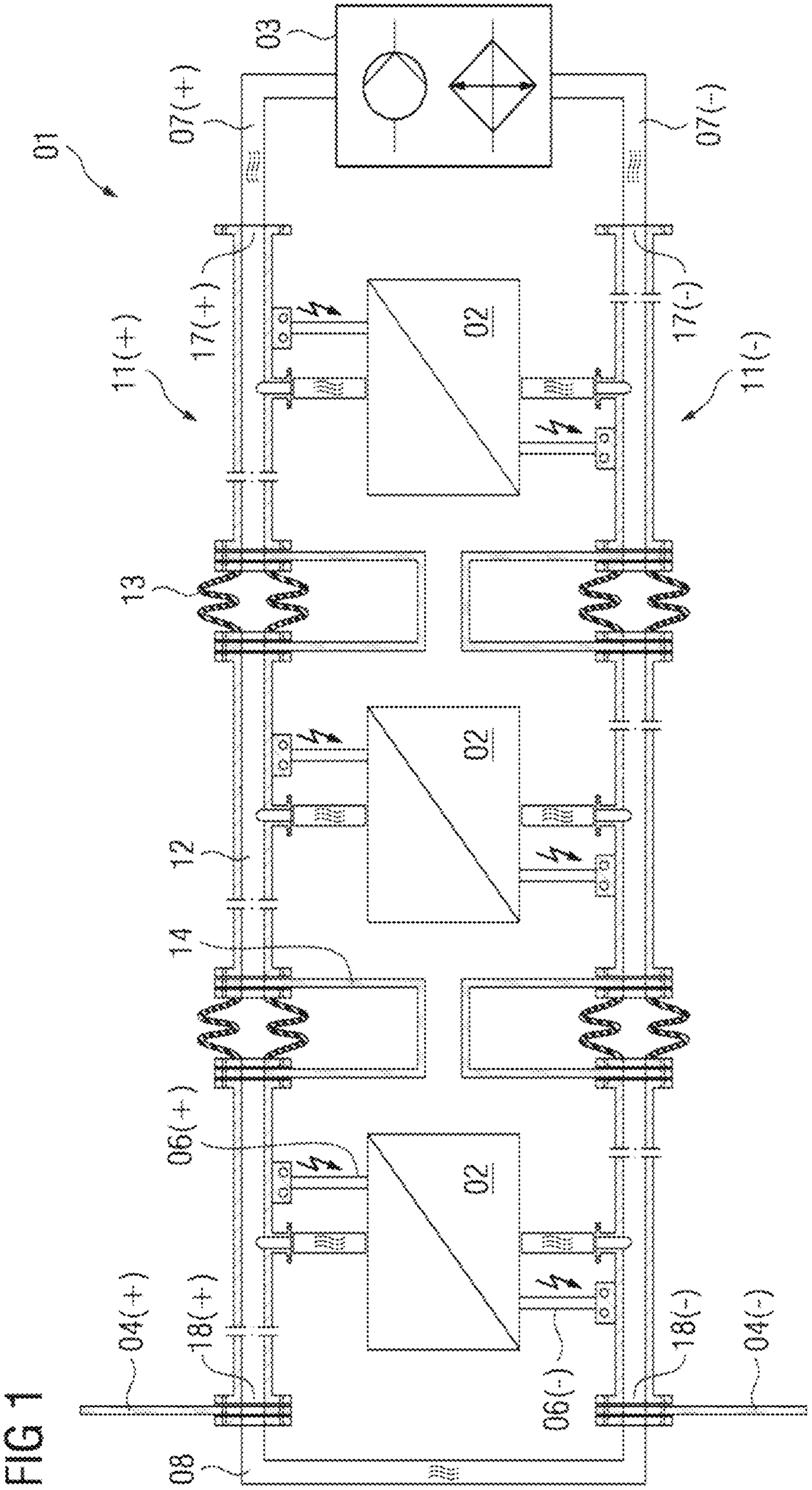
FIG. 1 shows an exemplary embodiment of an exemplary power converter arrangement with three power converters.

In FIG. 1, an exemplary embodiment for a power converter arrangement 01 according to the invention is schematically sketched. This comprises two power line pipes 11(+), 11(−) as essential elements. To these 11(+), 11(−), three power converters 02 are connected. The power line pipes 11(+), 11(−) have two functions.

The main purpose is current conduction, in each case from/to a main connection 04(+), 04(−), which 04 are arranged at a respective end of the power line pipes 11, via the line sections 12 to the respective power connection 16. The power converters 02 are connected to the power connections 16 via busbars 06(+), 06(−).

At the same time, the respective power line pipe 11 fulfils the function of carrying a coolant. For this purpose, the power line pipes 11 are designed to be hollow. In this case, the power line pipes 11 at one end (here opposite to the main connection) each have a supply connection 17(+), 17(−), which 17 are connected via non-conductive connecting pipes 07(+), 07(−) to a coolant supply means 03. Coolant connections 15 are arranged along the extent of the line section 12. Coolant flow from/to the coolant supply means 03 to/from the coolant connections 15 is thus made possible. The coolant supply means 03 comprises a coolant pump for conveying the coolant and a cooling device for cooling the coolant.

It is essential to be able to connect a power converter 02 to the two power line pipes 11, namely to a power connection and at the same time to a coolant connection.

In order to avoid a dead volume in the power line pipes 11, it is also provided that, opposite to the supply connections 17 in connection with the coolant supply means 03, further supply connections 18(+), 18(−) are present. Here, the two further supply connections 18 are connected to each other via a non-conductive connecting pipe 08. Since the coolant is required in particular for cooling the power converters 02, a relatively small cross-section can be selected for the connecting pipe.

Figure 2:
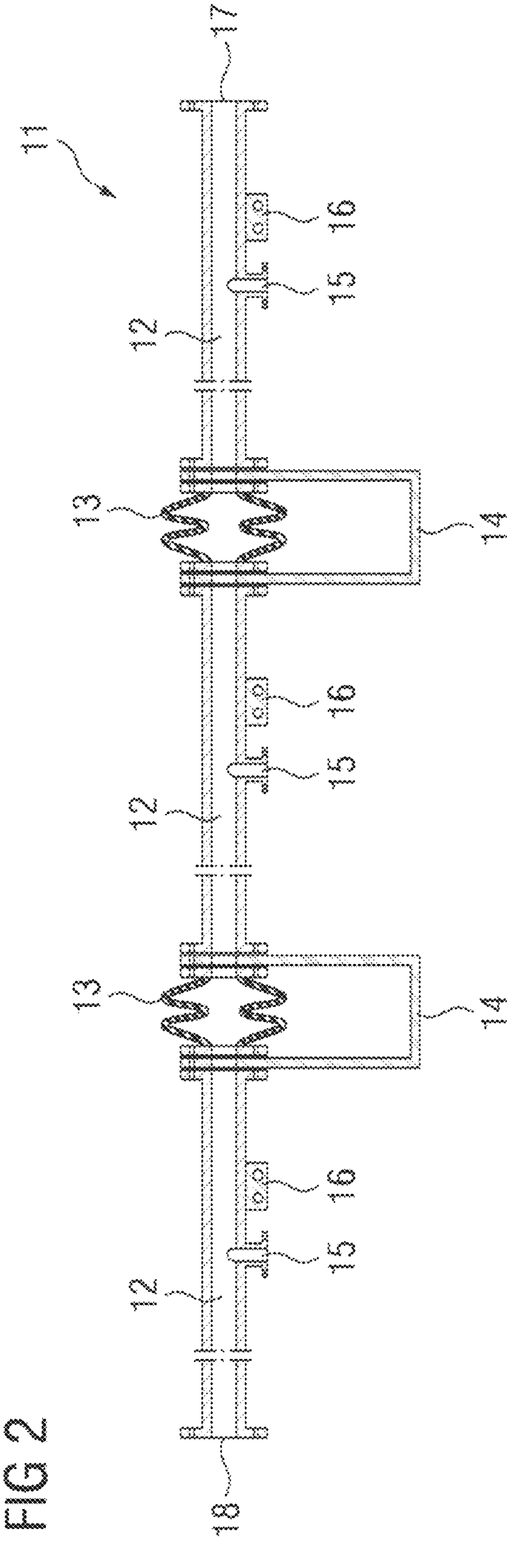
FIG. 2 shows an exemplary power line pipe to FIG. 1.

In FIG. 2, a power line pipe 11, which 11 is used in two ways in the power conductor arrangement 01 from FIG. 1, is sketched. In this exemplary embodiment, the power line pipe 11 comprises three sections, each with a line section 12, which 12 is designed in the manner of a pipe.

Figure 3:
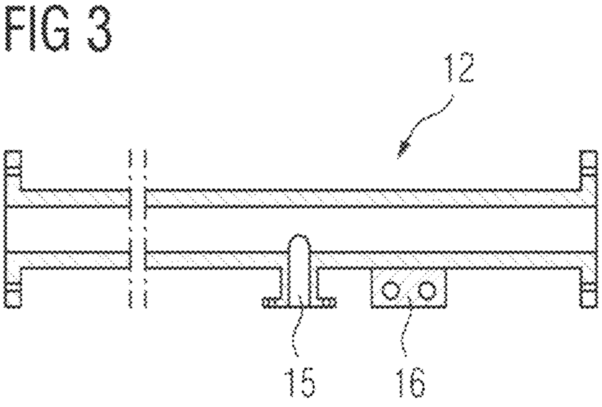
FIG. 3 shows a line section, used in the power line pipe from FIG. 2.

A coolant connection 15 and an adjacent power connection 16 is arranged at each of these three line sections 12, which 12 are again sketched in FIG. 3.

The connection of two line sections 12 is established by means of an expansion-compensation means, via which both the conduction of current and the carrying of coolant must be ensured. For this purpose, the expansion-compensation means has the task of allowing small changes in length, for example due to thermal expansions of the line sections 12.

Figure 4:
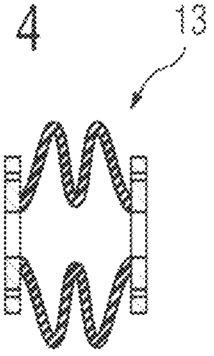
FIG. 4 shows a folding bellows, used in the power line pipe from FIG. 2.

In this exemplary embodiment, the expansion-compensation means comprises a folding bellows 13—see FIG. 4—which 13 allows the coolant to be carried from one line section 12 into the adjacent line section 12.

Figure 5:
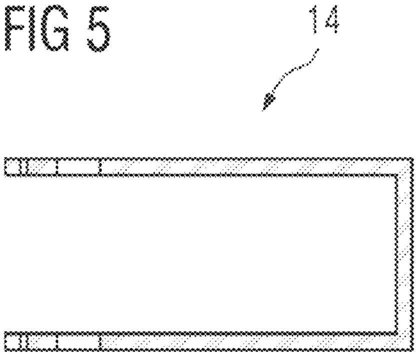
FIG. 5 shows a bridge, used in the power line pipe from FIG. 2.

Since it is not required here for the folding bellows 13 to be electrically conductive, the two opposite ends of the line sections 12 are connected to each other via a bridge 14—see FIG. 5. The bridge 14 is used here for conducting current and should have a particularly low resistance. The bridge 14 has a U-shape and thus also a certain elasticity.

The invention claimed is:

1. A power line pipe comprising:

at least one line section, which line section is in a form of a pipe for carrying a coolant and consists of a material with an electrical resistance of at least 0.075 μΩm, at least two coolant connections, to each of which coolant connections a coolant pipe is be connected, and at least two power connections, which power connections are spaced apart from each other and are each electrically conductively connected to the line section and are arranged adjacent to a coolant connection and a busbar being able to be connected to each power connection.

2. The power line pipe according to claim 1, wherein the electrical resistance of the material of the line section is at least 0.25 μΩm, in particular at least 0.5 μΩm and wherein the electrical resistance of the material of the power connections is at most 0.05 μΩm, in particular at most 0.025 μΩm.

3. The power line pipe according to claim 1, further comprising:

a main connection as a power connection at at least one end;

a supply connection as a coolant connection at at least one end; and at least two power connections, which are spaced apart from each other and from the ends, and at least two coolant connections, which are spaced apart from the ends.

4. The power line pipe according to claim 1, further comprising a first line section and at least a second line section and an expansion-compensation means, which is arranged between the line sections.

5. The power line pipe according to claim 4, wherein the expansion-compensation means is formed by an electrically conductive and coolant-carrying folding bellows or U-shaped or meandering pipe profile.

6. The power line pipe according to claim 4, wherein the expansion-compensation means comprises a coolant-carrying folding bellows or compensator and an electrically conductive bridge, which connects adjoining ends of the line sections to each other.

7. A power converter arrangement comprising a first power line pipe and a second power line pipe, each designed according to claim 1, and at least one power converter, which power converter is connected to the power connections via an electrically conductive busbar in each case and is connected to the coolant connections of the power line pipes via a non-conductive coolant pipe in each case.

8. The power converter arrangement according to claim 7, further comprising at least two, in particular at least three, power converters, which power converters are connected to the power line pipes.

9. The power converter arrangement according to claim 7, further comprising a coolant supply means, which coolant supply means is connected by way of a first non-conductive connection pipe to a first supply connection and by way of a second non-conductive connection pipe to a second supply connection.

10. The power converter arrangement according to claim 9, wherein the coolant supply means has a coolant pump and a cooling device.

11. The power converter arrangement according to claim 9, further comprising a non-conductive connecting pipe, which connecting pipe is connected in a coolant-carrying manner to supply connections opposite the connection to the coolant supply.

12. The power converter arrangement according to claim 7, further comprising at least one capacitor, which is connected to further power connections of the power line pipes.

13. The power converter arrangement according to claim 7, further comprising a DC voltage network, which is connected to the main connections and to which electrical loads are connected in turn.

* * * * *